(12) United States Patent
Li

(10) Patent No.: US 7,002,412 B2
(45) Date of Patent: Feb. 21, 2006

(54) TRANSCONDUCTANCE CIRCUIT

(75) Inventor: Po Ming Li, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 93 days.

(21) Appl. No.: 10/801,618

(22) Filed: Mar. 16, 2004

(65) Prior Publication Data

US 2005/0206449 A1 Sep. 22, 2005

(51) Int. Cl.
*H03F 3/45* (2006.01)
(52) U.S. Cl. .................................. 330/252; 330/260
(58) Field of Classification Search ............... 330/252, 330/260
See application file for complete search history.

(56) References Cited

U.S. PATENT DOCUMENTS

| | | | | |
|---|---|---|---|---|
| 5,432,474 | A | * | 7/1995 | Lauffenburger et al. .... 330/252 |
| 5,661,432 | A | * | 8/1997 | Chang et al. ............... 327/552 |
| 5,717,360 | A | * | 2/1998 | Vu et al. .................... 330/253 |
| 5,978,241 | A | * | 11/1999 | Lee ............................. 363/73 |
| 6,370,372 | B1 | | 4/2002 | Molnar et al. |
| 6,894,564 | B1 | * | 5/2005 | Gilbert ....................... 330/254 |

OTHER PUBLICATIONS

J. Choma, "A Three-Level Broad-Banded Monolithic Analog Multiplier", IEEE J. Solid-State Circuits, vol. SC-16, No. 4, Aug. 1981, pp. 392-399.
B. Gilbert, "Design Considerations For BJT Active Mixers", Low-Power HF Microelectronics: A Unified Approach, IEE., 1996, pp. 837-927.
D.Y. Kim, S.G. Lee, J. H. Lee, "Up-Conversion Mixer For PCS Application Using SiBJT", IEEE 2000 2nd International Conference on Microwave and Millimetre Wave Technology Proceedings, pp. 424-427.
M. Koyama, T. Arai, H. Tanimoto, Y. Yoshida, "A 2.5-V Active Low-Pass Filter Using All N-P-N Gilbert Cells With A 1 V P-P Linear Input Range", IEEE J. Solid-State Circuits, vol. 28, pp. 1245-1253, Dec. 1993, pp. 1246-1253.

* cited by examiner

*Primary Examiner*—Patricia Nguyen
(74) *Attorney, Agent, or Firm*—Conley Rose, P.C.

(57) ABSTRACT

A transconductance circuit having a feedback element for maintaining constant potential differences at a differential amplifier, which in turn allows an intermediate current signal to flow through a resistive load directly proportional to an input voltage signal. The intermediate current signal is amplified through an amplifying stage to a sub-harmonic stage.

20 Claims, 4 Drawing Sheets

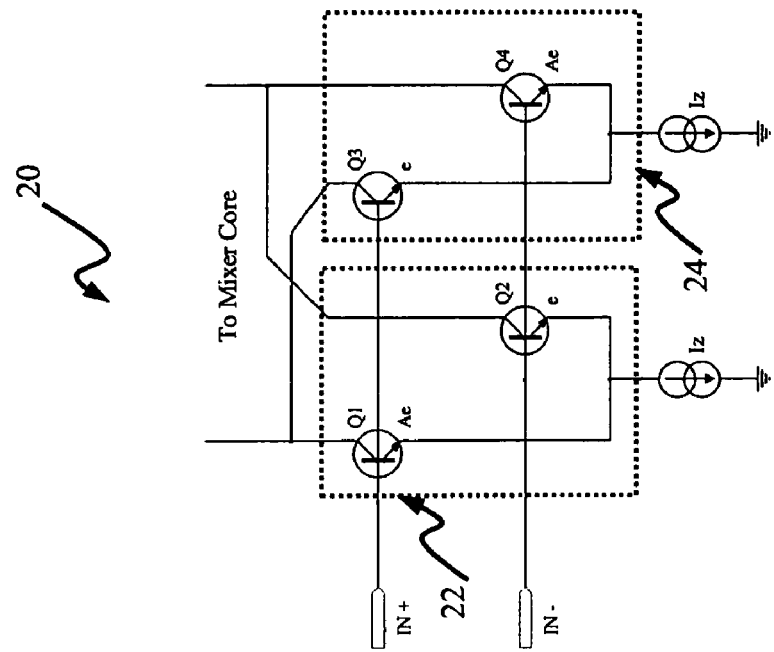
Fig. 2 - Prior Art
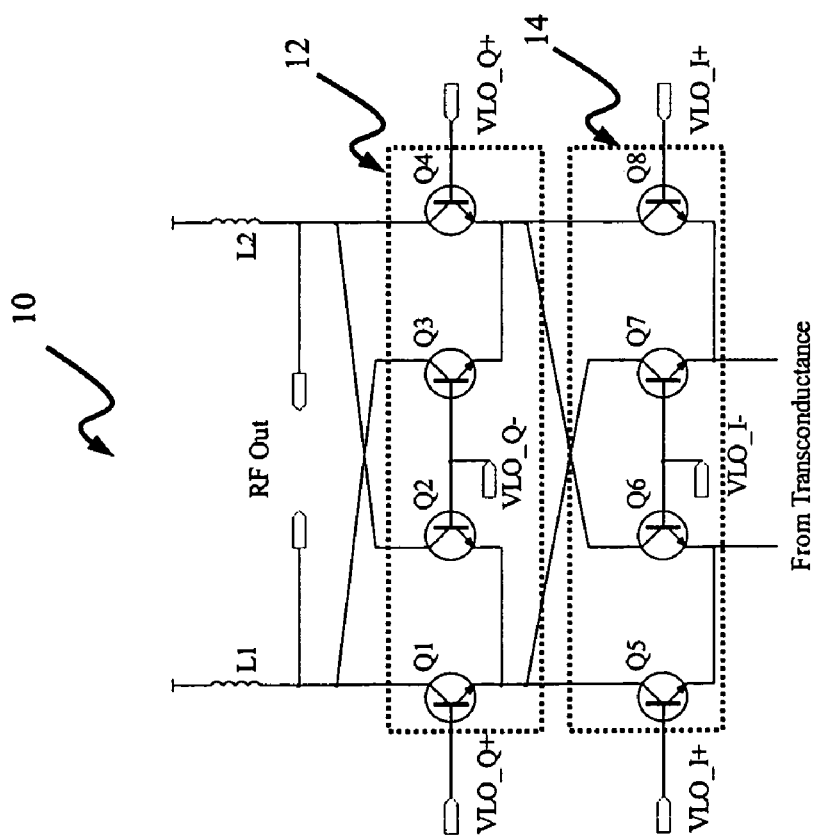
Fig. 1 - Prior Art

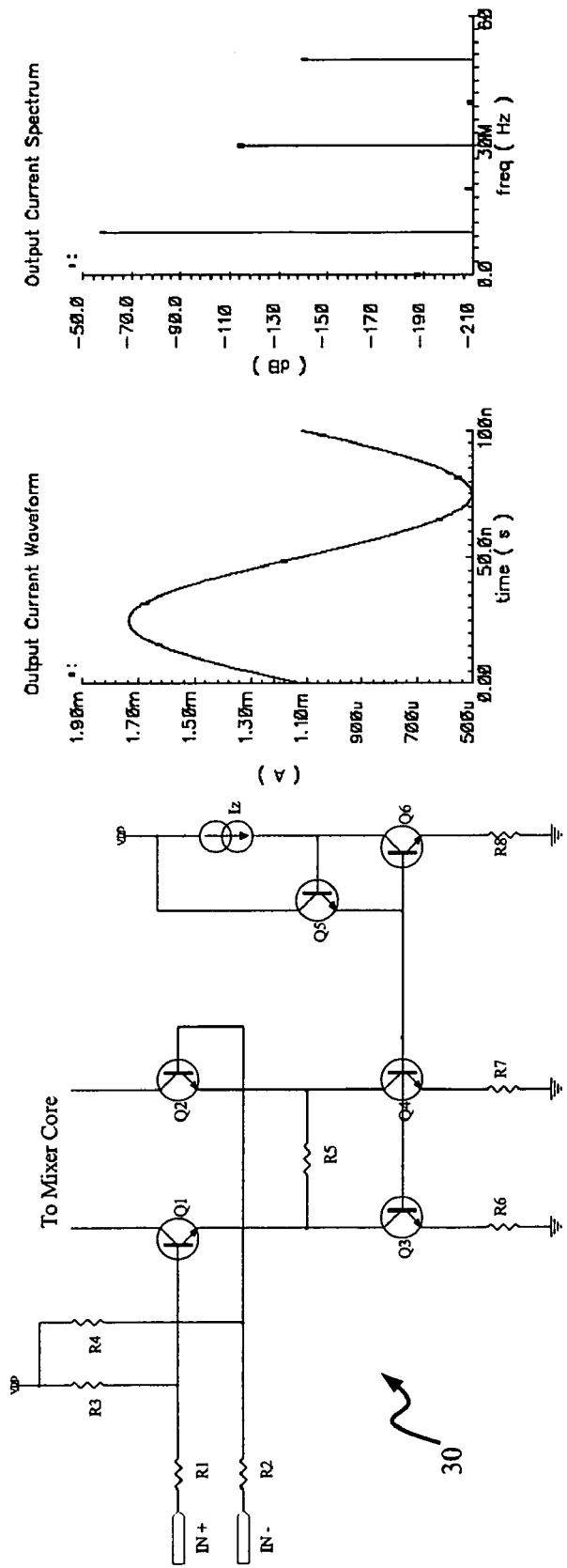
Fig. 3c – Prior Art
Fig. 3b – Prior Art
Fig. 3a – Prior Art

TRANSCONDUCTANCE CIRCUIT

FIELD OF INVENTION

The invention relates generally to transconductance circuits. In particular, the invention relates to a transconductance circuit having a feedback element for achieving high input-to-output signal linearity.

BACKGROUND

High-performance mixers are essential components in radio frequency application commonly found in modern telecommunication devices.

In particular, using a direct up-conversion mixer is a highly popular approach for mixer design because of the advantages in achieving high circuit integration, small integrated circuitry area and low power consumption.

Given the advantages of the direct up-conversion mixer, the next challenge in improving the performance of this mixer is to minimize its undesirable characteristics of local oscillator leakage, local oscillator self-modulation and input-to-output signal linearity.

During the operation of a direct up-conversion mixer, a local oscillator generates a clocking signal having a frequency that is exactly equivalent to a carrier frequency for modulating a base band signal fed through a transconductance stage of the mixer. This clocking signal may however "leak" to the output of the mixer and be amplified by a power amplifier, which is typically connected to the mixer output. This results in local oscillator leakage, which corrupts the frequency spectrum of the modulated output signal of the mixer and therefore creates problems for a receiver to properly demodulate the signal.

The presence of the power amplifier together with a parasitic path within the mixer can lead to electromagnetic coupling of the modulated output signal from the power amplifier's output to the local oscillator. Such undesirable electromagnetic coupling affects the working consistency of the local oscillator and is especially prominent when higher frequencies are used. This causes the problem of local oscillator self-modulation.

The use of a band pass filter at the output of the power amplifier is not able to suppress the leaked clocking signal since this leaked clocking signal has a frequency which is exactly the same as the carrier frequency.

U.S. Pat. No. 6,370,372 to Molnar proposes a sub-harmonic mixing stage 10, referring to FIG. 1, as an exemplary way of resolving the local oscillator leakage and self-modulation problems. Molnar discloses the use of two stacked Gilbert cells 12 and 14 when designing the sub-harmonic mixing stage of a radio frequency mixer. The advantage of the sub-harmonic mixing stage is an ability to operate at one half the clocking signal frequency. The mixer can then operate on one half the carrier frequency and any local oscillator leakage may be sufficiently filtered out by a band pass filter connected to the output of the power amplifier. By filtering out any local oscillator leakage the local oscillator leakage problem is disposed off. The self-modulation problem is resolved as the frequency of the modulated output signal is significantly lower from the local oscillator frequency so that the working consistency of the local oscillator is essentially maintained.

While Molnar proposes a sub-harmonic mixing stage 10 that may be used to eliminate problems associated with local oscillator leakage and self-modulation, there are problems attendant on this proposal. Due to the circuit configuration of the sub-harmonic stage 10, which requires a two-stack topology for a three-port multiplication function, substantial voltage headroom is needed for the sub-harmonic mixing stage 10 in order for the stage to be operational. This means that for a mixer that is operating on low voltage supply, very low voltage headroom is allocated for the operation of the transconductance stage.

A high-performance mixer has to maintain output linearity under the input of a large voltage signal generated from a base band signal. The inability to meet this linearity requirement causes the output signal spectrum to exceed a particular standard spectrum mask during the mixer operation. This inability to meet the linearity requirement of the IEEE 802.11a standard can lead to interference between signals of adjacent frequencies generated by other signal sources.

Typically, in the design of the mixing stage of the direct up-conversion mixer, the sub-harmonic mixing stage is used together with a transconductance stage. The sub-harmonic mixing stage operates based on a current commutative function that is driven by a large local oscillator signal. As long as the local oscillator amplitude is sufficiently large enough, the output signal of the mixer is able to achieve linearity with the input signal from the transconductance stage. Hence, the linearity performance of the direct up-conversion mixer is highly dependent on the transconductance stage. It is therefore desirable for a direct up-conversion mixer to have a transconductance stage with high linearity and current efficiency operating under a large input range and small voltage headroom.

One technique of providing linearized transconductance is to employ a Multi-hyperbolic Tangential transconductance circuit 20, as shown in FIG. 2. This technique uses a number of asymmetric differential transistor pairs 22 and 24 with specific transistor ratios and tail currents to extend the linear range of the transconductance stage of the mixer up to seven times of thermal voltage differentially. Although the Multi-hyperbolic Tangential technique is a good approach for linearizing a small input signal, this approach has a considerably limited signal handling capability of approximately 100 mV. This undesirably distorts any base band signal with large input amplitude.

One proposed method of increasing the signal handling capability is to employ an Emitter Degeneration transconductance circuit 30, as shown in FIG. 3a. This circuit 30 enables larger signal input, with amplitude as high as one half supply voltage differentially. However, the voltage headroom needed for the circuit 30 is large, consuming about 2V DC supply. For a low supply voltage such as 2.7V, there is only 0.7V of voltage headroom remaining for the sub-harmonic stage, which is typically insufficient for such a stage to function operationally. Moreover, the current efficiency of the Emitter Degenerated transconductance circuit 30 is rather low. The current efficiency is defined as the ratio of maximum output current amplitude to the DC bias current.

With reference to FIG. 3b and FIG. 3c, the DC bias current of the Emitter Degenerated transconductance circuit 30 is 1.1 mA and the maximum output current amplitude is 0.62 mA for a third harmonic of 55 dBc under a 1.25V peak 10 MHz differential input signal. Hence, the achievable current efficiency is 55% for the Emitter Degeneration transconductance circuit 30.

Accordingly there is a need for an input transconductance stage with high input-to-output signal linearity and high current efficiency that operates under a large input signal range and small voltage headroom for a direct up-conversion mixer.

SUMMARY

Embodiments of the invention disclosed herein possess improved performance relating to input-to-output signal linearity while achieving performance on high current efficiency. Additionally, the embodiments accept a larger input signal range and requires lower voltage headroom.

A transconductance circuit according to an embodiment of the invention for receiving an input signal and performing voltage-to-current conversion is disclosed. The transconductance circuit includes a differential amplifier having a first input terminal and a second input terminal for receiving an input voltage signal. A load for converting the input voltage signal into an intermediate current signal includes a first terminal and a second terminal.

The first terminal is connected to a first output terminal of the differential amplifier and the second terminal is connected to a second output terminal of the differential amplifier. An amplifying stage coupled to the load is used to amplify the intermediate current signal and provides an output current signal through an output terminal. A feedback element for maintaining potential differences between the first input terminal and the first output terminal and between the second input terminal and the second output terminal of the differential amplifier is coupled to the differential amplifier and the amplifying stage.

BRIEF DESCRIPTION OF THE DRAWING

Embodiments of the invention are described hereinafter with reference to the drawings, in which:

FIG. 1 is a circuit diagram of a prior art sub-harmonic mixing stage;

FIG. 2 is a circuit diagram of a prior art Multi-hyperbolic Tangential transconductance;

FIG. 3a is a prior art Emitter Degeneration transconductance, and

FIGS. 3b and 3c are charts illustrating output characteristics of the Emitter Degeneration transconductance of FIG. 3a;

DETAILED DESCRIPTION

With reference to the drawings, a transconductance circuit according to an embodiment of the invention for receiving an input signal and performing voltage-to-current conversion is disclosed. Various techniques of providing high input-to-output signal linearity under a large input signal range have been previously proposed. However, these techniques either require substantial voltage headroom or have low current efficiency and therefore are unsuitable for radio frequency applications that operate on low voltage and power supplies.

For purposes of brevity and clarity, the description of the invention is limited hereinafter to symmetrical transistors. This however does not preclude the application of embodiments of the invention to other circuit variations such as using asymmetrical transistors to achieve similar operating performance. The functional principles fundamental to the embodiments of the invention remain the same throughout the variations.

A transconductance circuit according to an embodiment of the invention includes a feedback element for maintaining constant potential differences at a differential amplifier. This allows a load voltage signal provided by the differential amplifier to develop across a passive resistive load. The load voltage signal in turn drives an intermediate current signal which is then amplified through an amplifying stage to a sub-harmonic stage.

The transconductance circuit provides improved performance relating to input-to-output signal linearity while achieving performance on high current efficiency. An additional advantage is the transconductance circuit accepts a larger input signal range and requires smaller voltage headroom for the operation of the transconductance circuit.

A preferred embodiment of the invention is described in greater detail hereinafter.

Figure 4:
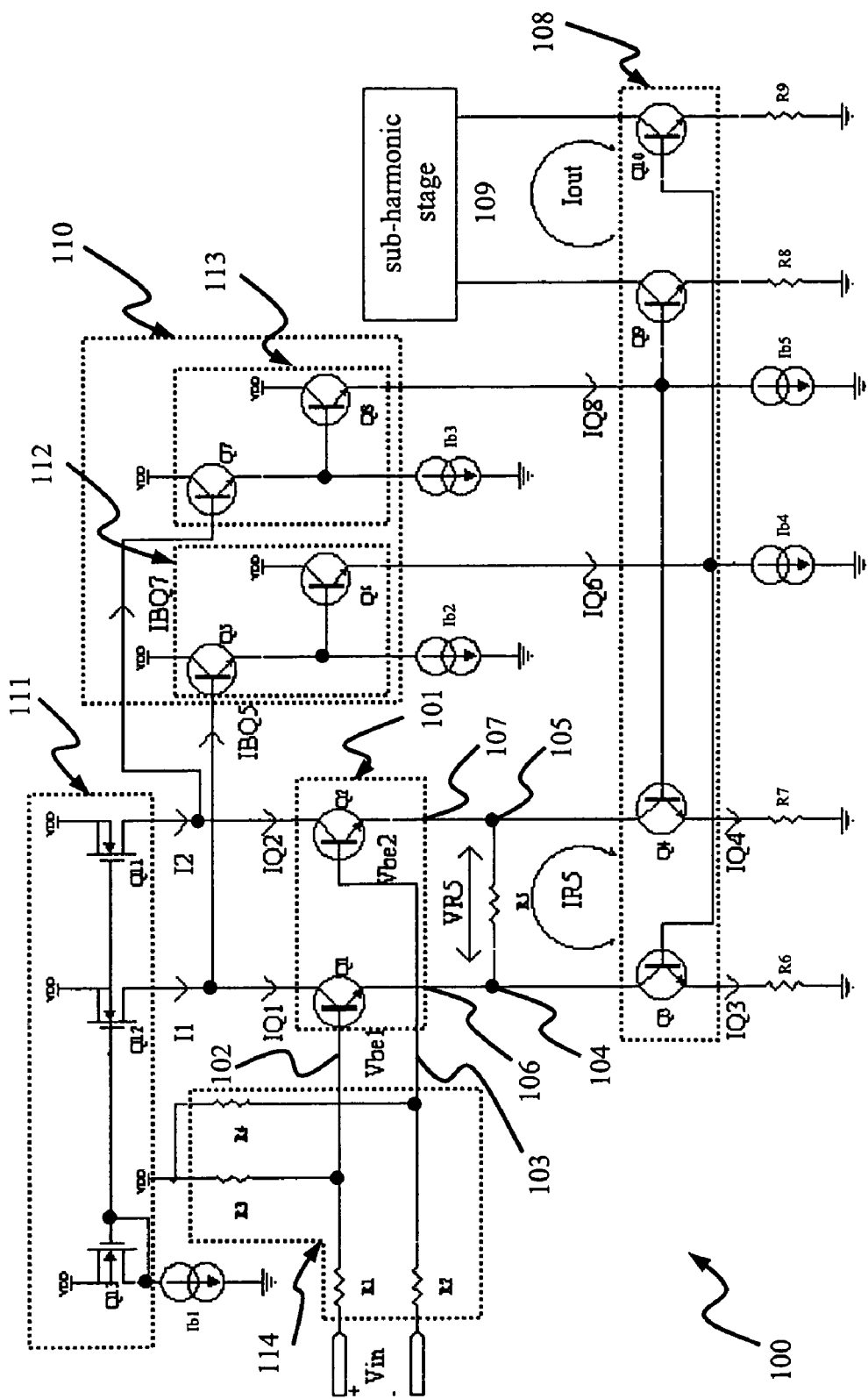
FIG. 4 is a circuit diagram of a transconductance circuit with current feedback loop according to an embodiment of the invention.

In such an embodiment described with reference to FIG. 4, a transconductance circuit 100 for receiving an input signal $V_{in}$ and performing voltage-to-current conversion is disclosed. The transconductance circuit 100 includes a differential amplifier 101 having a first input terminal 102 and a second input terminal 103 for receiving the input voltage signal $V_{in}$. The input voltage signal $V_{in}$ is received via an input port and channelled through a voltage divider 114 which preferably comprises resistor R1 to R4. Resistors R1 and R3 are interconnected and are further connected at the interconnection to the first input terminal 102. Similarly, resistors R2 and R4 are interconnected and are further connected at the interconnection to the second input terminal 103. The free terminals of resistors R3 and R4 are connected together to a 2.7V supply voltage VDD. The differential amplifier 101 also includes a first output terminal 106 and a second output terminal 107 and outputs a load voltage signal VR5.

The differential amplifier 101 preferably comprises at least two bipolar transistors, including a first transistor Q1 and a second transistor Q2. The base of the first transistor Q1 and the base of the second transistor Q2 are respectively connected to the first and second input terminals 102 and 103 for receiving the input voltage signal $V_{in}$. The differential amplifier 101 is biased by biasing means, which preferably comprises a constant current source in the form of a first current mirror 111.

The load voltage signal VR5 is applied across a load R5 for driving an intermediate current signal IR5 therethrough. The load R5 has a first terminal 104 and a second terminal 105. The first terminal 104 is connected to the first output terminal 106 of the differential amplifier 101 and the second terminal 104 is connected to the second output terminal 107 of the differential amplifier 101. An amplifying stage 108 coupled to the load R5 is used to amplify the intermediate current signal IR5 and provides an output current signal $I_{out}$ through an output port 109.

The first current mirror 111 comprises transistors Q11–13, in which the drains of a first transistor Q11 and a second transistor Q12 are respectively connected to the collectors of the second transistor Q2 and the first transistor Q1 of the differential amplifier 101. The gates of transistors Q11–13 are interconnected while the sources of transistors Q11–13 are connected to the 2.7V supply voltage VDD. The gate and drain of transistor Q13 are connected together to ground through a biasing current source $I_{b1}$.

The amplifying stage 108 preferably comprises a second current mirror comprising at least two pairs of transistors Q3, Q10, and Q4, Q9, in which the bases of each pair of transistors are interconnected and are further connected at the interconnection to ground through biasing current sources $I_{b4}$ and $I_{b5}$. The collectors of transistors Q3 and Q4 are respectively connected to the first terminal 104 and the second terminal 105 of the load R5. The emitters of transistors Q3 and Q4 are connected to ground respectively through biasing resistors R6 and R7 while the emitters of transistors Q9 and Q10 are connected to ground through respectively biasing resistors R8 and R9. The collectors of transistors Q9 and Q10 are used as the output port 109 for connection to a sub-harmonic stage.

A current feedback element 110 for maintaining constant potential differences between the first input terminal 102 and the first output terminal 106 and between the second input terminal 103 and the second output terminal 107 of the differential amplifier 101 is coupled to the differential amplifier 101 and the amplifying stage 108.

The current feedback element 110 comprises of at least two voltage followers 112 and 113. Each voltage follower 112 and 113 preferably comprises a cascaded emitter follower. A first transistor Q5 and a second transistor Q6 form a first voltage follower 112. The emitter of the first transistor Q5 and the base of the second transistor Q6 are connected together to ground through a biasing current source $I_{b2}$. Similarly, a first transistor Q7 and a second transistor Q8 form a second voltage follower 113. The emitter of the first transistor Q7 and the base of the second transistor Q8 are connected together to ground through a biasing current source $I_{b3}$. The collectors of transistors Q5 to Q8 are connected together to the 2.7V supply voltage VDD.

The bases of transistors Q5 of the first voltage follower 112 and Q7 of the second voltage follower 113 are respectively connected to the collectors of transistors Q1 and Q2 of the differential amplifier 101. The emitter of the second transistor Q6 of the first voltage follower 112 and the bases of transistor pair Q3, Q10 of the amplifying stage 108 are connected together. Similarly, the emitter of the second transistor Q8 of the second voltage follower 113 and the bases of transistor pair Q4, Q9 of the amplifying stage 108 are connected together.

The function of the current feedback element 110 is to drive an output current signal $I_{out}$ to change linearly with the input voltage signal $V_{in}$ up to a peak differential voltage of 1.5V. This is achieved by maintaining constant potential differences between the first input terminal 102 and the first output terminal 106 and between the second input terminal 103 and the second output terminal 107 of the differential amplifier 101 so that a load R5 connected across the output of the differential amplifier 101 is used as a passive device for performing voltage-to-current conversion. A typical passive device is a resistor.

The required supply voltage headroom for the transconductance circuit is less than 1V and this allows more than 1.7 V for the sub-harmonic stage for the 2.7V supply voltage VDD. This is sufficient for the sub-harmonic stage to achieve reasonable linearity.

The current feedback process is better understood by analyzing a current feedback loop facilitated by the current feedback element 110 in the transconductance circuit 100 as follows. As the input voltage signal $V_{in}$ increases, currents IQ1 and IQ2 increase accordingly as well. This causes currents IQ3 and IQ4 to increase simultaneously. This results in the increase in currents IQ6 and IQ8, thereby increasing base currents IBQ5 and IBQ7.

In the preferred embodiment, according to Kirchhoff's first law, currents I1 and I2 are represented by:

$$I1=IQ1+IBQ5$$

and $$I2=IQ2+IBQ7$$

Since currents I1 and I2 are generated from the constant current source 111, the increments of base currents IBQ5 and IBQ7 cause currents IQ1 and IQ2 to fall back to original values. This means that currents IQ1 and IQ2 remain constant under the variation of the input voltage signal $V_{in}$. The base to emitter voltages of Vbe1 and Vbe2 of transistor Q1 and Q2 respectively are then kept constant at all times. According to Kirchhoff's second law, input voltage signal $V_{in}$ is $$Vin=Vbe1+Vbe2+VR5$$

The load voltage signal VR5 changes linearly with both the input voltage signal $V_{in}$ and the intermediate current signal IR5, which is amplified by the amplifier stage 108 to produce the output current signal $I_{out}$. By current mirror amplification, the output current signal is:

$$Iout=IR5*A$$

wherein A is an amplifying gain of the amplifier stage 108. The output current signal $I_{out}$ is relayed to the sub-harmonic stage 108 through the output port 109.

Figures 5A, 5B, 5C, 5D:
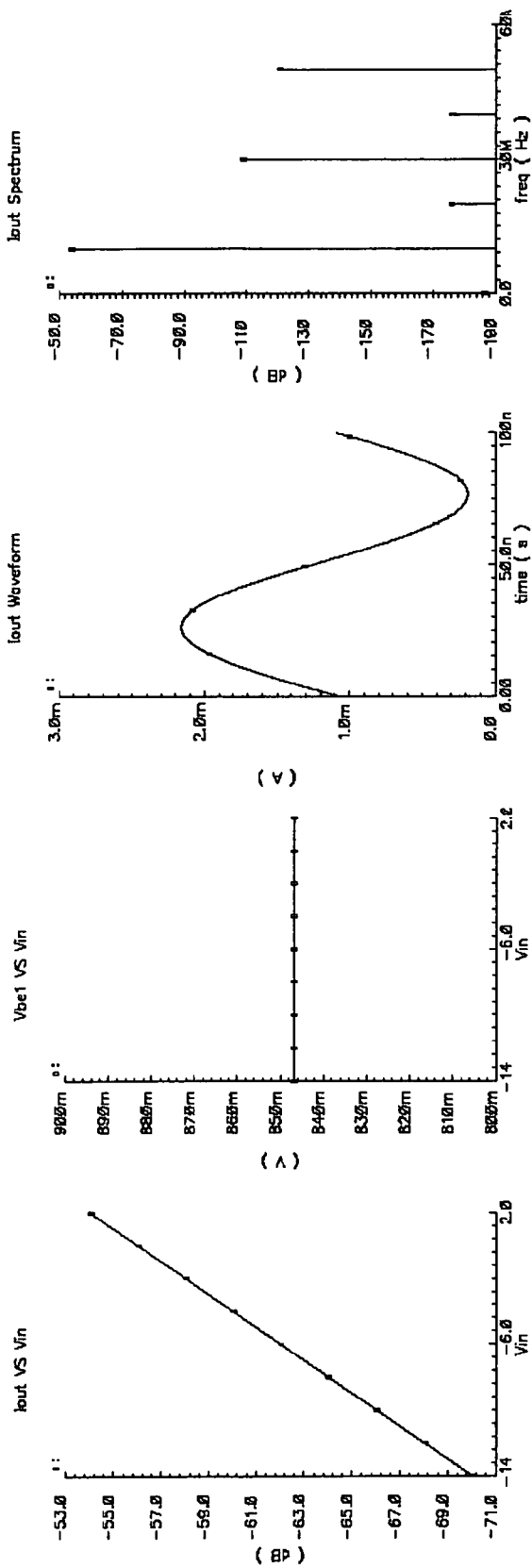
FIGS. 5a to 5d are charts illustrating output characteristics of the transconductance circuit with current feedback loop of FIG. 4.

As shown in FIG. 5a and FIG. 5b, simulation results are depicted by the plots of the output current $I_{out}$ in dB and the base to emitter voltage Vbe1 against the input voltage signal $V_{in}$ in dB. From the plots, $I_{out}$ is almost perfectly linear to the input voltage signal $V_{in}$ up to a maximum value of 2 dBV, thus attaining high input-to-output signal linearity. A 2 dBV input voltage signal is equivalent to a 1.25 peak differential voltage signal. Since transistors Q1 and Q2 are identical, their base to emitter voltages Vbe1 and Vbe2 are similar and are seen to be unaltered across the large input voltage signal range, which is substantially larger than that of the Multi-hyperbolic Tangential circuit 20.

With reference to FIG. 5c and FIG. 5d, the DC bias current is 1.1 mA and the maximum output current amplitude is 0.95 mA for a third harmonic of 55 dBc under a 1.25V peak 10 MHz differential input signal. The current efficiency is 85% for the transconductance circuit 100, which is significantly higher than the Emitter Degeneration transconductance circuit 30 as shown in FIG. 3b and FIG. 3c, under identical DC supply voltage condition.

The current output to the sub-harmonic stage 110 changes linearly with input signal voltage $V_{in}$ up to a full scale of DC bias current of transistors Q3 and Q4 with minimum distortion. As long as transistors Q11–Q13, which form the biasing source, are kept in saturation range, the above analysis stays valid.

The input frequency response is dependant on the current feedback loop formed by the cascaded emitter follower pairs 112 and 113. For typical sub-micron BiCMOS technology the transconductance circuit 100 operational bandwidth can reach up to 200 MHz, which is sufficient for an existing high-speed wireless communication standards.

Although only one embodiment of the invention is disclosed, it becomes apparent to one skilled in the art in view of this disclosure that numerous changes or modification can be made without departing from the scope and spirit of the invention. For example, although NPN bipolar transistors are used in the forgoing embodiment, the transistors may perform similar operation if substituted by enhancement or depletion type MOS transistors or the likes.

What is claimed is:

1. A transconductance circuit for receiving an input signal and performing voltage-to-current conversion, comprising:
    a differential amplifier having a first input terminal and a second input terminal for receiving an input voltage signal and providing a load voltage signal;
    a load for converting the load voltage signal into an intermediate current signal, the load having a first terminal and a second terminal, wherein the first terminal is connected to a first output terminal of the differential amplifier and the second terminal connected to a second output terminal of the differential amplifier;
    an amplifying stage coupled to the load for amplifying the intermediate current signal and having an output port for providing an output current signal;
    a current feedback element for maintaining constant potential differences between the first input terminal and the first output terminal and across the second input terminal and the second output terminal of the differential amplifier, the feedback element being coupled to the differential amplifier and the amplifying stage.

2. The transconductance circuit of claim 1, wherein the current feedback element comprises a first voltage follower and a second voltage follower.

3. The transconductance circuit of claim 2, wherein each of the first voltage follower and the second voltage follower comprises a cascaded emitter follower.

4. The transconductance circuit of claim 3, wherein each of the first voltage follower and the second voltage follower comprises a first transistor and a second transistor, the emitter of the first transistor being connected to the base of the second transistor.

5. The transconductance circuit of claim 1, wherein the differential amplifier comprises two transistors.

6. The transconductance circuit of claim 5, wherein the base of one of the two transistors is connected to the first input terminal and the base of the other of the two transistors is connected to the second input terminal.

7. The transconductance circuit of claim 6, wherein the collector of one of the two transistor is connected to the base of the first transistor of the first voltage follower and the collector of the other of the two transistors is connected to the base of the first transistor of the second voltage follower.

8. The transconductance circuit of claim 1, wherein the differential amplifier is biased by biasing means, the biasing means comprising a first current mirror.

9. The transconductance circuit of claim 8, wherein the first current mirror comprises at least three transistors.

10. The transconductance circuit of claim 9, wherein the first current mirror comprises a first and a second transistor, the drain of the first transistor being connected to the collector of one of the two transistors of the differential amplifier and the base of the first transistor of the first voltage follower, the drain of the second transistor being connected to the collector of the other of the two transistors of the differential amplifier and the base of the first transistor of the second voltage follower.

11. The transconductance circuit of claim 1, wherein the output port of the amplifier stage is coupled to a sub-harmonic stage.

12. The transconductance circuit of claim 1, wherein the amplifying stage comprises a second current mirror.

13. The transconductance circuit of claim 12, wherein the second current mirror comprises two pairs of transistors, the bases of each pair of transistors being interconnected.

14. The transconductance circuit of claim 13, wherein the interconnected bases of one of the two pairs of transistors are further connected to the emitter of the second transistor of the first voltage follower and the interconnected bases of the other of the two pairs of transistors are further connected to the emitter of the second transistor of the second voltage follower.

15. The transconductance circuit of claim 1, wherein the first input terminal and the second input terminal are coupled to a voltage divider.

16. The transconductance circuit of claim 1, wherein the load is a passive device.

17. The transconductance circuit of claim 16, wherein the passive device is a resistor.

18. A method for performing voltage-to-current conversion, comprising the steps of:
    applying an input voltage signal to a differential amplifier, the differential amplifier having a first input terminal, a second input terminal, a first output terminal and a second output terminal;
    providing a load voltage signal across the first output terminal and the second output terminal;
    maintaining constant potential differences between the first input terminal and the first output terminal and across the second input terminal and the second output terminal of the differential amplifier through a current feedback element;
    converting the load voltage signal into an intermediate current signal by applying the load voltage signal across a load.

19. The method of claim 18, further comprising the step of amplifying the intermediate current signal using an amplifying stage for producing the output current signal.

20. The method of claim 19, further comprising the step of coupling the output current signal to a sub-harmonic stage.

* * * * *